United States Patent [19]
Peng

[11] Patent Number: 5,774,004
[45] Date of Patent: Jun. 30, 1998

[54] HYSTERESIS LIMITER FOR CANCELING OFFSET BY DYNAMICALLY VARYING A REFERENCE VOLTAGE

[75] Inventor: Yung-Chow Peng, Hsinchu Hsien, Taiwan

[73] Assignee: Winbond Electronics Corp., Hsinchu, Taiwan

[21] Appl. No.: 824,335

[22] Filed: Mar. 26, 1997

[51] Int. Cl.[6] ............................. H03K 3/037; H03L 5/00
[52] U.S. Cl. .......................................... 327/205; 327/307
[58] Field of Search .................................. 327/205, 206, 327/73, 74, 68, 307, 337, 362

[56] References Cited

U.S. PATENT DOCUMENTS

| | | | |
|---|---|---|---|
| 4,616,145 | 10/1986 | Myers | 327/73 |
| 4,707,624 | 11/1987 | Yee | 327/307 |
| 5,040,724 | 8/1991 | Brinkruff et al. | 327/73 |
| 5,122,680 | 6/1992 | Stakely et al. | 327/206 |
| 5,166,632 | 11/1992 | MacKenzie | 327/307 |

Primary Examiner—Toan Tran
Attorney, Agent, or Firm—Gardere & Wynne, L.L.P.

[57] ABSTRACT

A hysteresis limiter including a hysteresis limiting circuit, a signal variance tracking device and a reference voltage selecting device can dynamically track variance of signals and adjust a reference voltage. The signal variance tracking device enters an offset tracking mode when there has not been any variance occurring in an output of the hysteresis limiting circuit for a predetermined period of time. In the offset tracking mode, the reference voltage selecting device continuously activates a change of the reference voltage until the output of the hysteresis limiting circuit becomes unstable. The unstable state implies that an offset is located, so treatment of the input signals can then be proceeded.

13 Claims, 3 Drawing Sheets

HYSTERESIS LIMITER FOR CANCELING OFFSET BY DYNAMICALLY VARYING A REFERENCE VOLTAGE

BACKGROUND OF THE INVENTION

1. Field of the Invention

The present invention relates to a hysteresis limiter for canceling offset, more particularly, to a hysteresis limiter for canceling all offsets from input signals and the limiter itself by continuously tracking the offsets and dynamically varying a reference voltage.

2. Description of Related Art

Until now, conventional hysteresis limiters try to eliminate offset by utilizing compensating capacitors. For example, U.S. Pat. No. 4,616,145 "ADJUSTABLE CMOS HYSTERESIS LIMITER" by Myers discloses a hysteresis limiter to implement offset cancellation by utilizing switched capacitor circuits. A voltage source provides a fixed reference voltage to the limiter. Accordingly, the hysteresis limiter can only eliminate the offset generated by itself. It is not possible for the limiter to eliminate, compensate or correct the offset due to input signals. Furthermore, each of the switched capacitor circuits of the application is single-ended but not a balanced circuit. Therefore, there may be additional offset due to charge rejection.

U.S. Pat. No. 5,166,632 "LIMITER CIRCUIT WITH MEANS TO ELIMINATE OFFSET AND AN OPTIONAL SELECTIVE THRESHOLD" by MacKenzie discloses a limiter circuit, which utilizes analog method, wherein a DC level of an output voltage is filtered out and stored in a capacitor with large capacitance. Then the DC level is fed back to an input side of the limiter. The limiter utilizes a constant voltage as a reference voltage. Since the voltage stored in the capacitor contains the offsets of the input signal and the hysteresis limiter itself, such method can reduce the effect of the offsets. However, in order to filter DC voltages from the signals, a high capacitance and a large RC time constant are required, that is, a capacitor with a considerable size is required. Therefore, it is not possible to implement high density and integration for such a limiter circuit.

SUMMARY OF THE INVENTION

One object of the present invention is to provide a hysteresis limiter for effectively canceling offsets generated from input signals and the limiter itself by continuously adjusting a reference voltage.

Another object of the present invention is to provide a hysteresis limiter for canceling offset by utilizing simple digital circuits to permit integration.

In accordance with a first aspect of the present invention, the hysteresis limiter comprising a hysteresis limiting circuit, a signal variance tracking means and a reference voltage selecting means can dynamically track variance of signals and adjust a reference voltage. The signal variance tracking means enters an offset tracking mode when there has not been any variance occurring in an output of the hysteresis limiting circuit for a predetermined period of time. In the offset tracking mode, the reference voltage selecting means continuously activates a change of the reference voltage until the output of the hysteresis limiting circuit becomes unstable. The unstable state implies that an offset is located, so treatment of the input signals can then be proceeded.

In accordance with another aspect of the present invention, the hysteresis limiter further comprises an output stabilizing means to maintain an output of the limiter as previous when the limiter is in a tracking mode, thereby the output of the limiter can be maintained at a stable state.

In accordance with a further aspect of the present invention, each portion of the hysteresis limiter is constructed with simple digital circuits, such as electronic switches, latches, multiplexers, logical gates and the like.

Other objects, advantages and novel features of the invention will become more apparent from the following detailed description when taken in conjunction with the accompanying drawings.

DETAILED DESCRIPTION OF PREFERRED EMBODIMENT

In an electronic system, offset generated from input signals or any portion of the system can influence the sensitivity of the system, even resulting in an error. The hysteresis limiter of the present invention utilizes a hysteresis phenomenon occurring between an input and an output to locate the offset of the system, whereby the offset can be dealt with.

Figure 1:
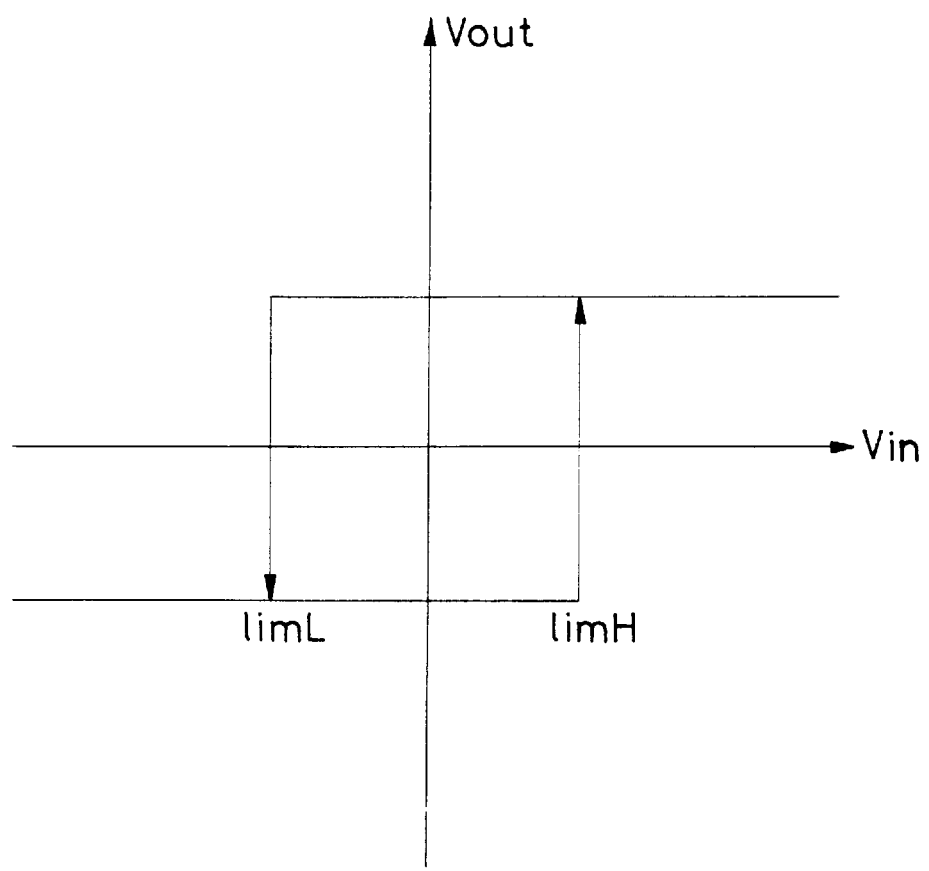
FIG. 1 is a diagram showing the hysteresis between an input voltage and an output voltage.

A typical hysteresis phenomenon between an input voltage and out voltage is shown in FIG. 1. As can be seen in this figure, an output voltage $V_{out}$ of a comparator is high and low dynamically when an input signal $V_{in}$ is alternatively compared to limit voltages limL and limH in the case that the input voltage $V_{in}$ is zero or very small itself and an offset voltage is in the range between the upper and lower limit voltages limH and limL. However, if the offset voltage is out of the range, then the output can not vary.

In the present invention, a reference voltage of a comparator is continuously adjusted to approach an actual offset value, so as to cancel the effect of the offset. In order to approach the offset voltage, the reference voltage is adjusted increasingly if an output voltage remains to be high, and is adjusted decreasingly if the output voltage remains to be low until the output voltage becomes unstable. The reference voltage in the case that the output voltage is unstable is close to the offset. Accordingly, simple process can be implement to filter the offset and retain the actual signal.

Figure 2:
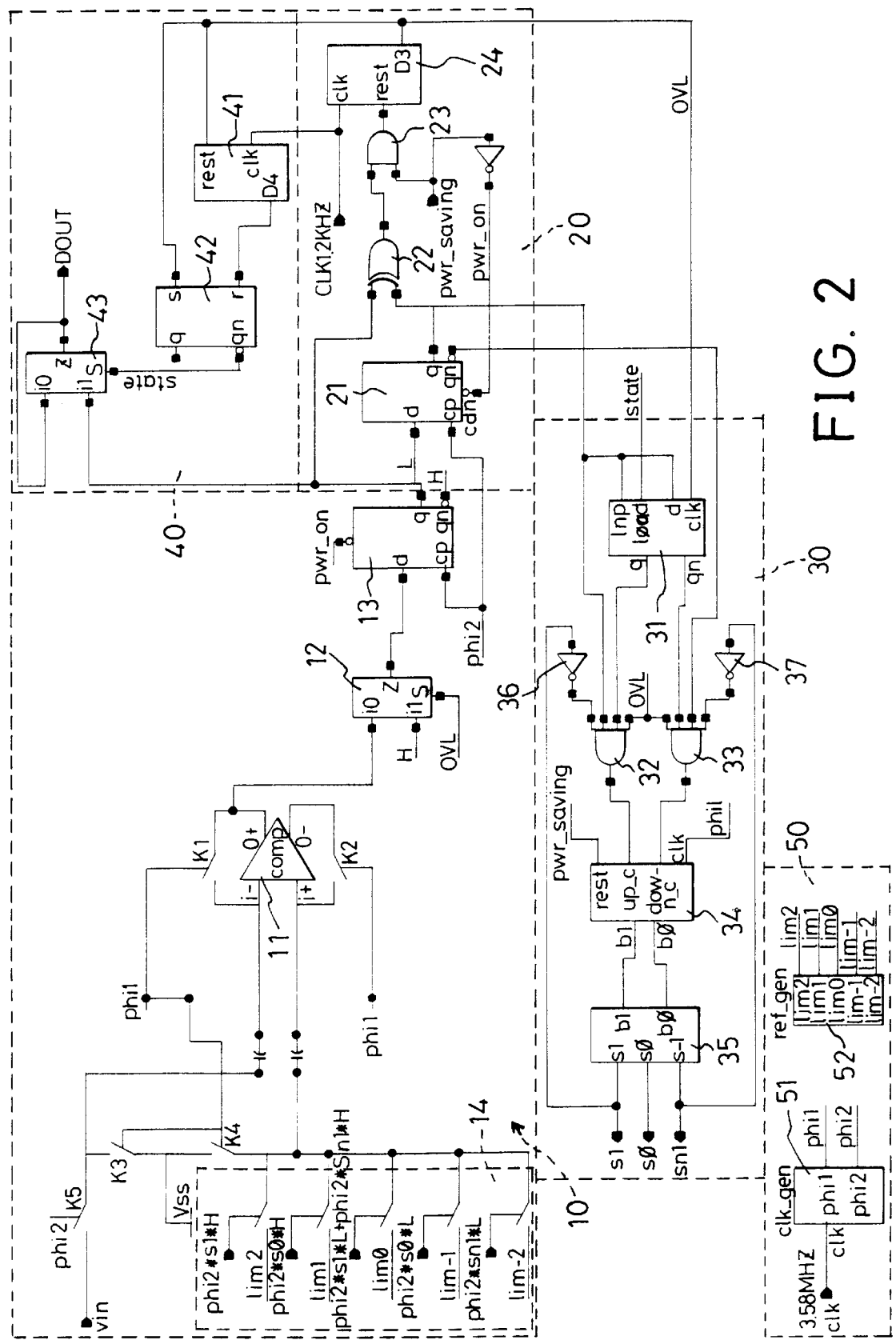
FIG. 2 shows a circuit diagram of the hysteresis limiter in accordance with the present invention.

Referring to FIG. 2, an embodiment of the hysteresis limiter in accordance with the present invention comprises a hysteresis limiting circuit 10 with a reference voltage switching means 14, a signal variance tracking means 20, a reference voltage selecting means 30, an output stabilizing means 40 and a pulse/reference voltage generator 50. The pulse/reference voltage generating means 50 comprises a pulse generator 51 for generating two pulse signals phi1, phi2 which are inverse to each other based on a clock (clk) of 3.58 MHz and a reference voltage generator 52 for generating multiple reference voltages lim2 to lim−2. The two pulse signals phi1, phi2 are transmitted to the hysteresis limiting circuit 10 for signal switching. The respective reference voltage is provided to the reference voltage switching means 14 in the hysteresis limiting circuit 10.

The hysteresis limiting circuit 10 comprises a comparator 11, which is connected with an input voltage $V_{in}$ and the reference voltage switching means 14, a multiplexer 12, which is connected with an output of the comparator 11 at an input terminal, and a data latch 13. Electronic switches K1–K4, which are controlled by the pulse signal phi1, are connected between the positive output and negative input of the comparator 11, negative output and positive input of the comparator 11, and a bottom plate of an input capacitor and an analog ground reference (VSS), respectively. An electronic switch K5, which is controlled by the pulse signal phi2, is connected between the bottom plate of an input capacitor, which is connected with the negative input of the comparator 11 in series, and the $V_{in}$. A trigger signal OVL from the signal variance tracking means 20 is transmitted to a selecting terminal S of the multiplexer 12. The pulse signal phi2 is also provided to the clock port CP of the data latch 13.

In a normal mode, the two pulse signals phi1, phi2 are activated alternatively. When the pulse signal phi1 is high, the offsets of the positive and negative output signals of the comparator 11 are stored in a capacitor. Sequentially, the input voltage $V_{in}$ is fed in the system when phi2 turns to be high. A result that the comparator 11 compares $V_{in}$ and the reference voltage from the reference voltage switching means 14 is output from a positive output (q) thereof to the signal variance tracking means 20 through the multiplexer 12 (when OVL is low) and the data latch 13. When the signal variance tracking means 20 detects no variance in the level of the input signal, the tracking means 20 automatically outputs a trigger signal OVL with high level. Then the multiplexer 12 switches to be disconnected with the output signal of the comparator 11 after which the hysteresis limiter enters a tracking mode. The trigger signal OVL is reset when the clock CLK of the signal variance tracking means 20 sends another pulse, and then is varied with the input voltage $V_{in}$.

The signal variance tracking means 20 comprises a data latch 21, logical gates 22, 23, and a counter 24, wherein the logical gate 22 is an XOR gate, and the logical gate 23 is an AND gate. A logical operation of a previous signal and the current signal are processed by the data latch 21 and the logical gate 22. The counter 24 is reset through the logical gate 23 when the previous signal and the current signal are at the different level. After a predetermined counting time t1 of the counter 24 has passed, (herein the counting time t1 is output from an output pin D3 of the counter 24, wherein D3 becomes active after the counter 24 continuously counts three clocks, and t1 is set to be between 1.67 ms and 2.25 ms, since a clock CLK is 1.2 KHz and is asynchronous with a signal at a REST input terminal, and the lowest frequency of the input signal in applications of the field of caller ID is 1 KHz) a high level trigger signal OVL is transmitted to activate switching in the multiplexer 12 of the hysteresis limiting 10 and notify the output stabilizing means 40 and the reference voltage selecting means 30 to enter into an operating state.

The reference voltage selecting means 30 comprises a data latch 31, logical gates 32, 33, a counter 34, a decoder 35, and two inverse gates 36, 37 for controlling the upper and lower limits. The data latch 31 has a load pin (load) connected with the state signal for clearing stored content when the system turns from the tracking mode to be the normal mode. The positive and negative outputs of the data latch 21 of the signal variance tracking means 20 are sent to the logical gates 32, 33, respectively. Furthermore, both the logical gates 32, 33 are controlled by the trigger signal OVL and positive and negative outputs of the data latch 31. The encoder 35 generates three selecting signals s1, s0, and sn1, and stops the operation thereof when the highest and lowest selecting signals s1 and sn1 are fed back to the logical gates 32, 33 via the inverse gates 36, 37, respectively. The selecting signals are transmitted to the reference voltage switching means 14. The reference voltage switching means 14 proceeds logical operation for each of the combinations of respective selecting signals, the pulse signal phi2 and L, H signals respectively from the data latch 13, so as to control the ON/OFF state of each of the internal electronic switches in order to adjust the internal reference voltage. The counter 34 proceeds upward or downward counting according to whether the input signal is high or low, so as to cause variance of the signals of the decoder 35, and accordingly control the reference voltage switching means 14 to adjust upward or downward the reference voltage. The adjusting is stopped when two sequential signals (a signal sent to the reference voltage selecting means and the previous signal stored in the data latch 31) are different (the input is unstable), that is, the offset is similar or close to the current reference voltage. A process for compensating or eliminating the offset can then be proceeded.

The output stabilizing means 40 comprises a counter 41, an SR latch 42, and a multiplexer 43. The positive input q of the data latch 13 of the hysteresis limiting circuit 10 is connected to the multiplexer 43. A positive output of the multiplexer 43 is set to be the data output DOUT. After the high level trigger signal OVL is received by the output stabilizing means 40, a low level signal (state) is transmitted to a selecting terminal S of the multiplexer 43 via the SR latch 42, so as to maintain the output DOUT at a previous state. Namely, the output can be maintained to be stable when the system is the tracking mode, thereby avoiding negative effects for the proceeding stage of the system. When the tracking mode is terminated, that is, the trigger signal OVL turns to be low, the counter 41 begins to operate. The SR latch 42 is reset and the communication of multiplexer 43 to the hysteresis limiting circuit 10 is recovered after the counter 41 has counted for a predetermined delay time t2 (the delay time is output from an output pin D4 of the counter 41, wherein D4 becomes active after the counter 41 continuously counts four clocks, and t2 is set to be about 3.33 ms since CLK and the signal at the REST input terminal are synchronous).

Figure 3:
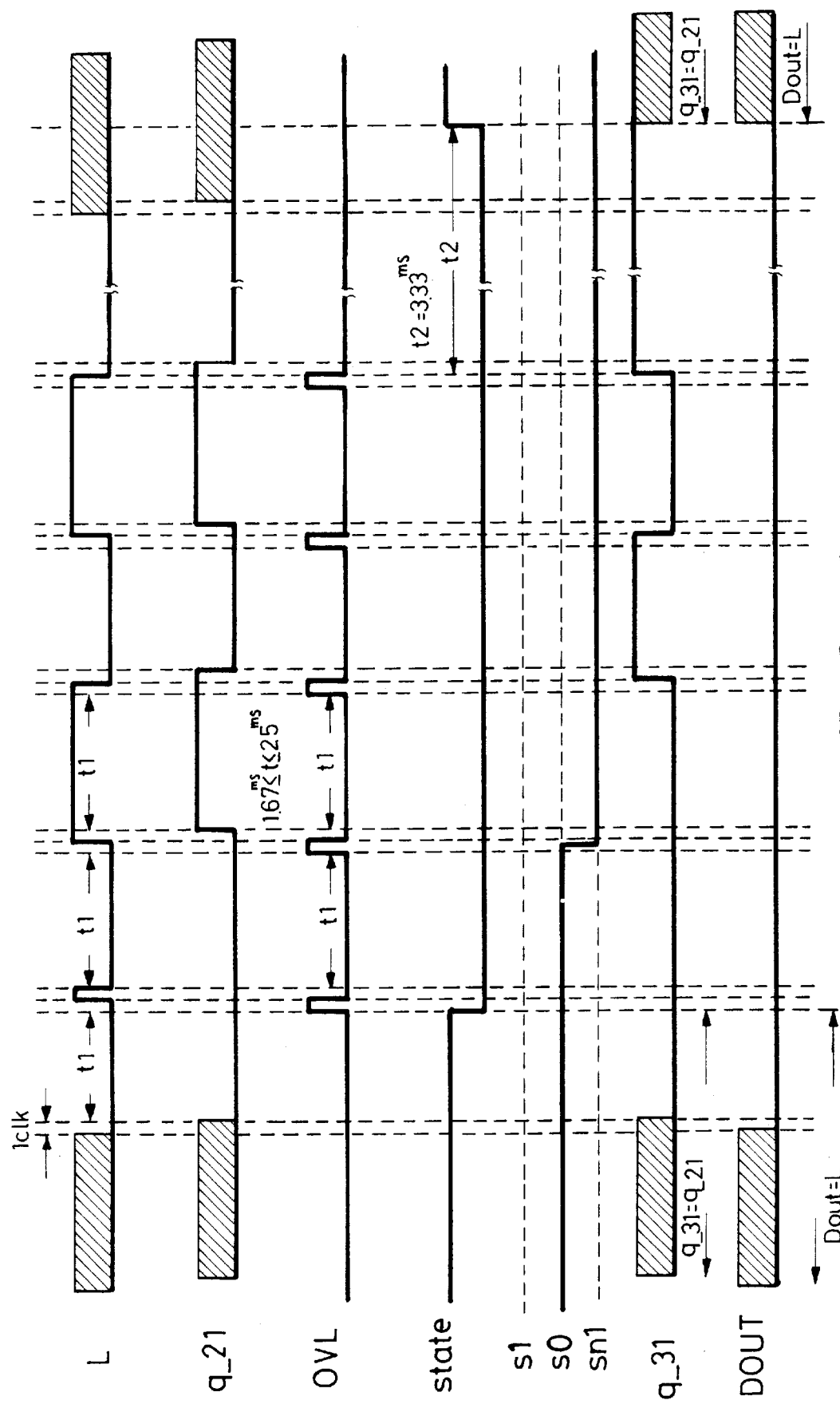
FIG. 3 is a timing diagram showing an operation to lower a reference voltage by one level.

Referring to FIG. 3, an example in which the reference voltage control signal is adjusted downward from s0 to sn1 will be described in conjunction with this timing diagram, wherein $q_{13}21$ and $q_{13}31$ indicate the positive output waveforms of the latches 21, 31, respectively. The output signal L of the latch 13 implies the output of the comparator 11 directly.

(i) Firstly, the output of the comparator 11 is low (it can be known since L=0). The signal variance tracking means 20 sets OVL to be high (OVL=1) after the tracking means 20 has tracked the low state of the output of the comparator 11 for a period of time t1. The signal OVL with high level drives the SR latch 42 to set the signal "state" to be low (state=0), and therefore the whole system enters the tracking mode. However, if the period of time that the output of the comparator 11 maintains as low does not exceed t1, the system is maintained in the normal mode.

(ii) At a next clock period (1 clk) after OVL=1, the inverse output signal H is fed back to the latch 13 through the switching of the multiplexer 12 to drive the latch 13 to output an inverse signal (that is, L=1).

Such operation has two functions, one is to make sure whether the input signal (the offset) is in the hysteresis range, the other is to reset the signal OVL, so that OVL can be in a pulse form. This is because an inverse signal is input to the multiplexer 12 when OVL=1, resulting in the XOR gate 22 generates a pulse to reset the counter 24.

(iii)–(a) If the output of the comparator 11 becomes high (that is, a variance occurs) in the next period t1 after the pulse occurs in the signal OVL, the reference voltage selecting means 30 is inactive since the output values of the two sequential periods t1 recorded in the two latches 21, 31 are inverse to each other.

(iii)–(b) If the output of the comparator 11 is still low in the next period t1 after the pulse occurs in the signal OVL, which means that the offset is below the hysteresis range, the values recorded in the two latches are both low level. When a next pulse occurs in the signal OVL, the output of the logical gate 33 is 1, thereby driving the counter 34 to count down and accordingly driving the output of the decoder 35 to be adjusted downward by a step, that is, the output of the decoder 35 is adjusted from s0 to sn1, and therefore causing the reference voltage sent to the comparator 11 to be adjusted downward by a step by the reference voltage switching circuit.

(iv) Repeat the steps (ii) and (iii) until the output of the comparator 11 changes, that is, becomes high in this example. After no more pulse has occurred in the signal OVL for a period of delay time t2 (e.g. 3.33 ms), then the counter 41 outputs a signal to reset the SR latch 42, so that the signal "state" is 1 to lead the system returns to the normal mode. The signal "state" activates the latch 31 to enter a load state, so the output of the comparator 11 in such normal mode responds to the latch 31 to be an initial value for the subsequent tracking mode.

In sum, there is a pulse generated in the trigger signal OVL when a signal from the output terminal L of the hysteresis limiting circuit 10 has continuously been high or low for a period of time longer than the counting time t1 of the counter 24. The signal "state" is also pulled to be low. The signal "state" is maintained to be low during a long period of time since the interval between the pulses of the trigger signal OVL is shorter than a delay time t2 of the signal "state". The data output DOUT is maintained at the previous state during this period of time. The output of the decoder 35 of the reference voltage selecting means 30 is adjusted downward by a step, that is, s0 goes from high to low and sn1 turns to high. The reference is accordingly varied downward. After adjustment, variance occurs in the signal from the output terminal L, and this means that the optimal adjusting point is located.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A hysteresis limiter for canceling offset by dynamically varying a reference voltage, said hysteresis limiter comprising:

a hysteresis limiting circuit having an input for receiving an input signal, a reference voltage switching means to supply the reference voltage, an output signal of said hysteresis limiting circuit being unstable if offset is in a limited range or being stable if offset is out of said range;

a signal variance tracking means having a tracking mode and a normal mode, for generating a trigger signal to drive the hysteresis limiter to enter the tracking mode when detecting that there has been no variance in the output signal from said hysteresis limiting circuit for a predetermined period of time; and a reference voltage selecting means for generating a selecting signal to drive said reference voltage switching means of said hysteresis limiting circuit to adjust the reference voltage according to a level state of said output signal from said hysteresis limiting circuit in correspondence to the trigger signal, and stopping adjustment if said output signal from said hysteresis limiting circuit becomes unstable.

2. The hysteresis limiter according to claim 1, further comprising a clock generator for generating a clock signal used for said hysteresis limiting circuit.

3. The hysteresis limiter according to claim 2, wherein said clock generator generates two pulse signals being inverse to each other.

4. The hysteresis limiter according to claim 1, further comprising a reference voltage generator connected to the reference voltage switching means, for generating various reference voltages.

5. The hysteresis limiter according to claim 1, further comprising an output stabilizing means for maintaining a data output of the output signal of the hysteresis limiting circuit at a previous state held in the tracking means when the hysteresis limiter is in the tracking mode.

6. The hysteresis limiter according to claim 5, wherein said output stabilizing means comprises an SR latch and a multiplexer.

7. The hysteresis limiter according to claim 6, wherein said output stabilizing means further comprising a counter, the data output being recovered to normal connection to the output stabilizing means when said counter has counted for a predetermined period of time after the tracking mode is stopped.

8. The hysteresis limiter according to claim 1, wherein said hysteresis limiting circuit further comprising a comparator, a multiplexer for converting an output of said comparator at a given time and a data latch for locking signals an output signal from the multiplexer with a clock signal.

9. The hysteresis limiter according to claim 8, wherein said reference voltage switching means comprises a plurality of electronic switches connected to various reference voltages.

10. The hysteresis limiter according to claim 1, wherein said signal variance tracking means comprises a data latch and a plurality of logical gates, and compares a previous state and a current state of the output signal of said hysteresis limiting circuit to determine if there is variance present in the output signal.

11. The hysteresis limiter according to claim 10, wherein said signal variance tracking means further comprising a counter for countering a delay time.

12. The hysteresis limiter according to claim 1, wherein said reference voltage selecting means comprising a plurality of logical gates, a counter and a decoder.

13. The hysteresis limiter according to claim 12, wherein said reference voltage selecting means further comprising a data latch having a load pin for receiving a signal to clear a previous state of said data latch when the hysteresis limiter returns to the normal mode.

* * * * *